United States Patent
Li et al.

(10) Patent No.: US 9,461,147 B2
(45) Date of Patent: Oct. 4, 2016

(54) SEMICONDUCTOR STRUCTURE

(71) Applicant: UNITED MICROELECTRONICS CORP., Hsin-Chu (TW)

(72) Inventors: Jhen-Cyuan Li, New Taipei (TW); Shui-Yen Lu, Tainan (TW); Yen-Liang Wu, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/562,782

(22) Filed: Dec. 8, 2014

(65) Prior Publication Data

US 2016/0126334 A1 May 5, 2016

(30) Foreign Application Priority Data

Nov. 5, 2014 (CN) .......................... 2014 1 0617923

(51) Int. Cl.
*H01L 29/66* (2006.01)
*H01L 29/78* (2006.01)

(52) U.S. Cl.
CPC ..... *H01L 29/6656* (2013.01); *H01L 29/66795* (2013.01); *H01L 29/785* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,642,090 B1 | 11/2003 | Fried | |
| 8,420,464 B2 | 4/2013 | Basker | |
| 2009/0008705 A1* | 1/2009 | Zhu | H01L 29/66795 257/327 |
| 2009/0045411 A1* | 2/2009 | Lin | H01L 29/66553 257/77 |
| 2011/0049628 A1* | 3/2011 | Okumura | H01L 21/2236 257/347 |
| 2011/0101421 A1 | 5/2011 | Xu | |
| 2011/0147828 A1* | 6/2011 | Murthy | H01L 21/02057 257/327 |
| 2011/0272739 A1* | 11/2011 | Lee | H01L 29/66795 257/192 |

* cited by examiner

*Primary Examiner* — Khaja Ahmad
(74) *Attorney, Agent, or Firm* — Winston Hsu; Scott Margo

(57) ABSTRACT

The present invention provides a semiconductor structure, including a substrate, having a fin structure disposed thereon, a gate structure, crossing over parts of the fin structure. The top surface of the fin structure which is covered by the gate structure is defined as a first top surface, and the top surface of the fin structure which is not covered by the gate structure is defined as a second top surface. The first top surface is higher than the second top surface, and a spacer covers the sidewalls of the gate structure. The spacer includes an inner spacer and an outer spacer, and the outer pacer further contacts the second top surface of the fin structure directly.

9 Claims, 6 Drawing Sheets

SEMICONDUCTOR STRUCTURE

BACKGROUND OF THE INVENTION

1. Field of the Invention

The present invention relates generally to a method of forming a semiconductor device, and more particularly, to a method for pulling down a fin structure after an inner spacer is formed, and an outer spacer is then formed, so as to protect the fin structure and the gate structure.

2. Description of the Prior Art

In order to increase the carrier mobility of semiconductor structure, applying tensile stress or compressive stress to a gate channel has been widely practiced. For instance, if a compressive stress were to be applied, it has been common in the conventional art to use the selective epitaxial growth (SEG) technique to form an epitaxial structure such as a silicon germanium (SiGe) epitaxial layer in a silicon substrate. As the lattice constant of the SiGe epitaxial layer is greater than the lattice constant of the silicon substrate, thereby producing stress to the channel region of PMOS transistor, the carrier mobility is increased in the channel region and speed of MOS transistor is improved accordingly. Conversely, a silicon carbide (SiC) epitaxial layer could be formed in the silicon substrate to produce tensile stress for the gate channel of an NMOS transistor.

Despite the aforementioned approach improving the carrier mobility in the channel region, the complexity of the overall process also increases accordingly. For instance, the conventional approach typically forms a recess in the silicon substrate, deposits a buffer layer in the recess and then forms an epitaxial layer thereafter. Nevertheless, the buffer layer formed by this approach typically has uneven thickness, such that in most cases the bottom portion of the buffer layer is approximately three to five times thicker than the sidewall portion of the buffer layer. This causes negative impacts such as short channel effect or drain induced barrier lowering (DIBL) and degrades the quality and performance of the device.

SUMMARY OF THE INVENTION

The present invention provides a semiconductor structure, which comprises a substrate, having a fin structure disposed thereon, a gate structure, crossing over parts of the fin structure, wherein the top surface of the fin structure which is covered by the gate structure is defined as a first top surface, and the top surface of the fin structure which is not covered by the gate structure is defined as a second top surface, the first top surface being higher than the second top surface, and a spacer covers sidewalls of the gate structure, wherein the spacer includes an inner spacer and an outer spacer, and the outer spacer contacts the second top surface of the fin structure directly.

The present invention further provides a method for forming a semiconductor structure, at least comprising the following steps: first, a substrate is provided, a fin structure is disposed on the substrate, and a gate structure is crossed over parts of the fin structure, an inner spacer is formed on two sidewalls of the gate structure, and the inner spacer covers a top surface of the fin structure. Next, a pull down process is performed to the fin structure, to remove parts of a top portion and parts of a sidewall portion of the fin structure, wherein after the pull down process is performed, the top surface of the fin structure which is not covered by the gate structure is defined as a second top surface, and a space is then formed between the second top surface and a bottom surface of the inner spacer, and an outer spacer is formed, at least covering the second top surface and filling in the space.

The feature of the present invention is that after the inner spacer is formed, an additional etching process (pull down process) is performed, so as to shrink the height and the width of the fin structure, and therefore a space will be formed right under the inner spacer. The outer spacer is then filled in the space, and contacts the sidewall of the fin structure directly. In this way, the fin structure and the gate structure can be protected well, avoiding being damaged by others etching processes, such as the pre-cleaning process of the following epitaxial process, and thereby further increasing the quality of the semiconductor structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
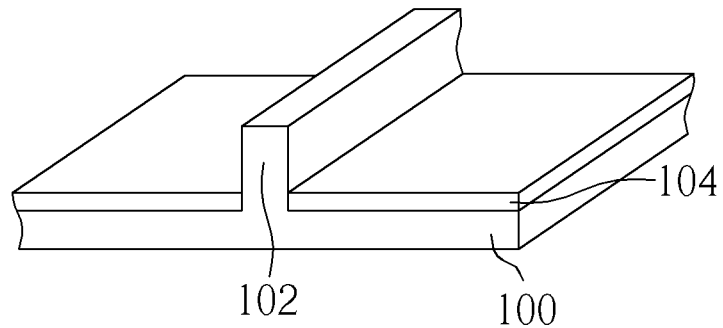
FIGS. 1-8 illustrate a method of forming a semiconductor device according to an exemplary embodiment of the present invention.

Please refer to FIG. 1 through FIG. 8, which illustrate a method of forming a semiconductor device according to an exemplary embodiment of the present invention. As shown in FIG. 1, a substrate 100 is provided, and the substrate 100 is a bulk substrate such as a silicon substrate, an epitaxial silicon substrate, a silicon germanium substrate, a silicon carbide substrate or a substrate made of semiconductor material, but is not limited thereto. A mask layer (not shown) is formed on the substrate, wherein the mask layer includes a pad oxide layer (not shown) and a nitride layer (not shown) located on the pad oxide layer. A photolithography process is first performed to pattern the mask layer for forming a patterned pad oxide layer (not shown) and a patterned nitride layer (not shown) and exposing a part of the substrate 100. Then, an etching process can be performed on the substrate 100 by using the patterned pad oxide layer and the patterned nitride layer as a hard mask, so that at least a fin structure 102 can be formed from the part of the substrate 100 that is not etched. The fin structure 102 may protrude from the patterned pad oxide layer and the patterned nitride layer. Subsequently, an insulating layer 104 such as an oxide layer is further formed on the substrate 100 except for the substrate 100 where the fin structure 102 is formed thereon, and the insulating layer 104 may be formed through processes such as a deposition process and an etching back process, to be later used as shallow trench isolation (STI) structure. Accordingly, the fin structure 102 can be formed on the substrate 100, and the insulating layer 104 can be formed on the substrate 100 except for the substrate 100 where the fin structure 102 is formed thereon. Afterwards, the patterned pad oxide layer and the patterned nitride layer are removed.

In another exemplary embodiment (not shown), a substrate as a silicon-on-insulator (SOI) substrate is provided, in this case, the fin structure mentioned above can be formed through etching the SOI substrate directly, since the isolation layer disposed on the substrate can serve as the STI. So in this embodiment, the STI is no need to be formed. Compared with the embodiment shown in FIG. 1, the difference does not affect later semiconductor processes of the present invention. The embodiments illustrated above only serve as examples. The fin structure in the present invention can have a variety of embodiments, which are not described for the sake of simplicity. The following description is based on a single fin structure of the embodiment shown in FIG. 1, but the semiconductor process of the present invention can also be applied to a substrate having the fin structure or a plurality of fin structures.

Figure 2:
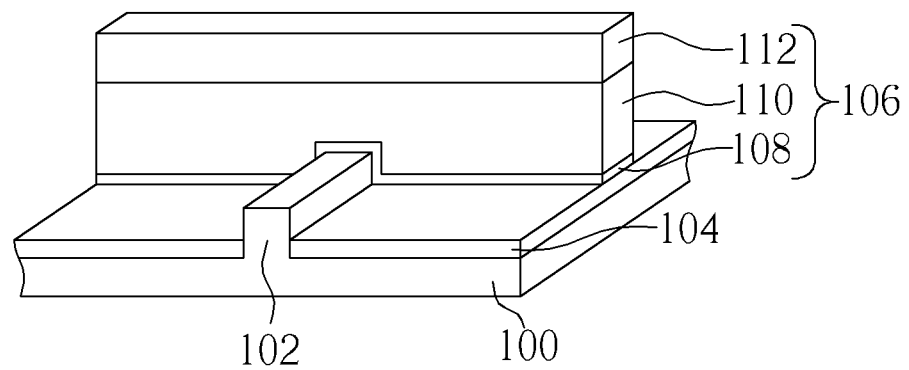

As shown in FIG. 2, a gate structure 106 partially overlapping the fin structure 102 is formed. The method of forming the gate structure 106 may include the following steps. At first, a gate dielectric material layer (not shown), a gate conductive material layer (not shown) and a cap material layer (not shown) are sequentially formed on the substrate 100. Then, a patterning process is performed with a patterned photoresist layer (not shown) or a patterned layer as a mask. The gate dielectric material layer, the gate conductive material layer and the cap material layer can therefore be patterned to form the gate structure 106 including a gate dielectric layer 108, a gate conductive layer 110 and a cap layer 112, and the mask is removed. The material of the gate dielectric layer 108 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The material of the gate conductive layer 110 may include undoped polysilicon, heavily doped polysilicon, or one or a plurality of metal layers such as a work function metal layer, a barrier layer and a low-resistance metal layer, etc. The cap layer 112 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof.

In this exemplary embodiment, the formed gate structure 106 includes the gate dielectric layer 108 made of silicon oxide, the gate conductive layer 110 made of doped polysilicon and the cap layer 112 made of a silicon nitride layer and a silicon oxide layer sequentially disposed on the gate conductive layer, but is not limited thereto. Various metal gate processes may be used in the present invention, including a gate-first process, a high-k first process integrated into the gate-last process, and a high-k last process integrated into the gate-last process. As the gate conductive layer 110 of the gate structure 106 includes a polysilicon layer, a replacement metal gate (RMG) process, such as a gate-last process, can be later performed to replace the polysilicon layer with a metal layer.

Figure 3:
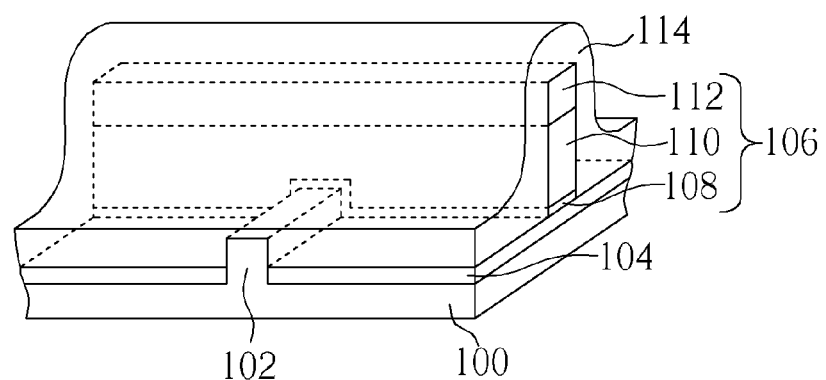

As shown in FIG. 3, a dielectric layer 114 is entirely formed on the substrate 100 to cover the fin structure 102, the insulating layer 104 and the gate structure 106. The dielectric layer 114 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. In addition, the material of the dielectric layer 114 is preferably different from the material of a top of the cap layer 112; therefore, in this exemplary embodiment, the dielectric layer 114 is made of silicon carbonitride (SiCN) through atomic layer deposition (ALD) process, but is not limited thereto.

Figure 4:
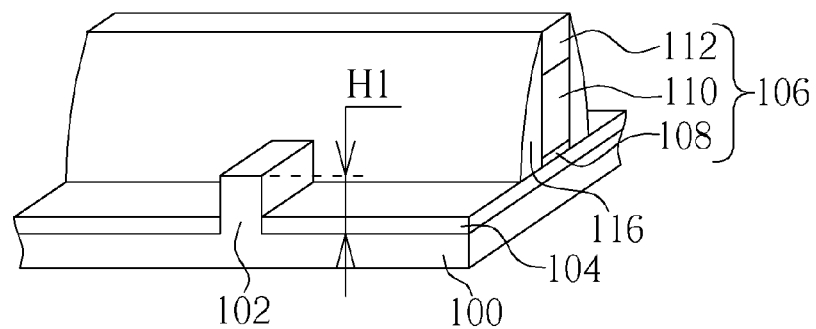

Please refer to FIG. 4. Subsequently, a first etching process E1 serving as a main etching process is performed to remove a part of the dielectric layer 114 to form an inner spacer 116. The first etching process E1 may be a dry etching process, a wet etching process or a combination thereof. In this exemplary embodiment, the process gas of the first etching process E1 includes methyl fluoride ($CH_3F$) and oxygen ($O_2$). Besides, the inner spacer 116 aligned with the cap layer 112 of the gate structure 106 partially overlaps the fin structure 102. More specifically, the formed inner spacer 116, which may serve as a gate spacer, surrounds the gate structure 106 and overlaps the sidewalls of the gate structure 106, and overlaps apart of the fin structure 102 adjacent to the gate structure 106; in particular, it overlaps a part of a top surface of the fin structure 102.

It is noteworthy that during the etching process E1, the fin structure 102 can be exposed simultaneously, or after the etching process E1, another etching process is then performed, so as to expose the fin structure 102, especially to expose the places of the fin structure 102 that are not covered by the gate structure 106 and are not covered by the inner spacer 116 either. In other words, the dielectric layer 114 which covers those places mentioned above will be removed, and the fin structure 102 will be exposed. Besides, as shown in FIG. 4, the height from the substrate 100 to the top surface of the fin structure 102 is defined as a first height H1.

Figure 5:
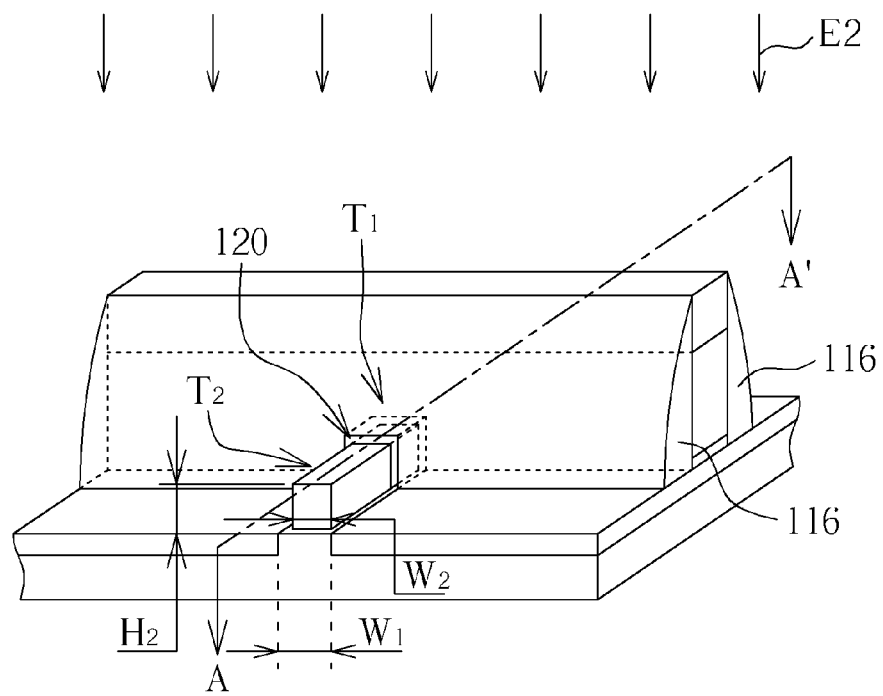
Figure 5A:
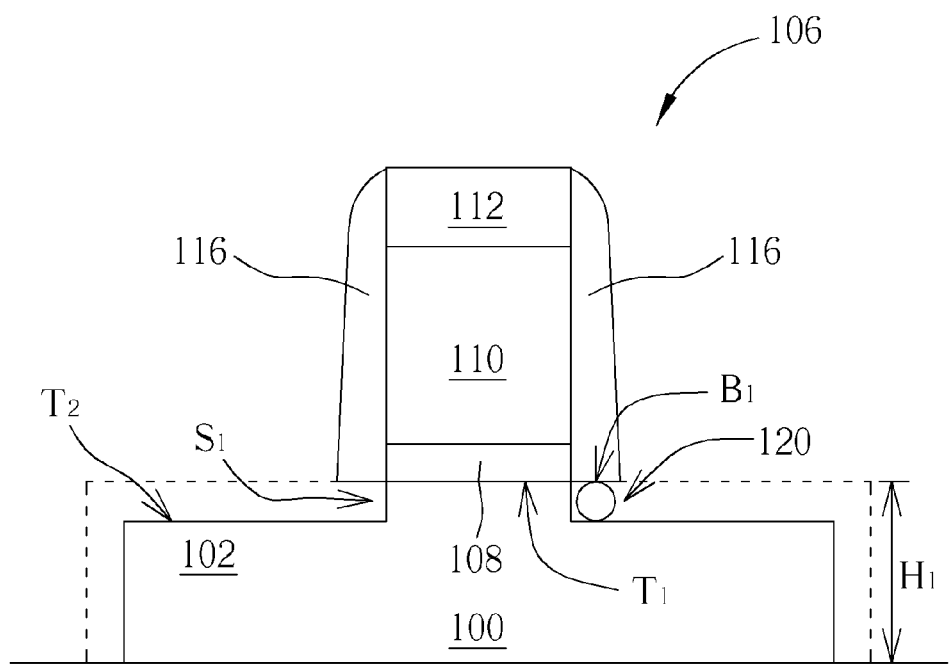
FIG. 5A is the cross section diagram of the semiconductor structure along cross section line A-A' of FIG. 5.

Next, please refer to FIG. 5 and FIG. 5A, wherein FIG. 5A is the cross section diagram of the semiconductor structure along cross section line A-A' of FIG. 5. As shown in FIG. 5, after the inner spacer 116 is formed, an etching process E2 (or it can be deemed as a pull down process) is then performed to the fin structure 102, to partially remove a top portion of the fin structure 102 and a sidewall portion of the fin structure 102. In other words, after the etching process E2 is performed, the height and the width of the exposed fin structure 102 is decreased (compared with the height and the width of the fin structure 102 shown in FIG. 1). Preferably, the decreased height or decreased width during the etching process E2 occupies 5%~10% value of the original height or the original width. Here the top surface of the fin structure 102 which is covered by the gate structure 106 is defined as the first top surface T1, and the exposed top surface of the fin structure 102 after the etching process E2 is performed is defined as the second top surface T2, where the second top surface T2 is lower than the first top surface T1. In addition, please also refer to FIG. 4 mentioned above, the height which from the substrate 100 to the first top surface T1 is defined as a first height H1, and the height which from the substrate 100 to the second top surface T2 is defined as a second height H2, and the ratio of the second height H2 to the first height H1 is preferably between 0.9~0.95. Besides, in the present invention, since the inner spacer 116 partially covers the fin structure 102, and the fin structure 102 is partially removed during the etching process E2, so the bottom surface of the inner spacer 116 which is disposed on the top surface of the fin structure 102 is defined as the first bottom surface B1, and there is a space 120 formed between the first bottom surface B1 and the second top surface T2 (as shown in FIG. 5A). A first sidewall S1 which is between the first top surface T1 and the second top surface T2 of the fin structure 102 will be exposed in the space 120. As shown in FIG. 5, the original width of the fin structure 102 is defined as W1, and the width of the fin structure 102 after the etching process E2 is performed is defined as W2, the ratio of W2/W1 is preferably between 0.9~0.95.

It is noteworthy that the etching process E2 may be performed through varied methods: one method is using a dry-etching process to etch the fin structure directly, the dry-etching process mentioned above may comprises an isotropic etching or an anisotropic etching, besides, if the dry-etching process is an anisotropic etching, after the etching process E2 is performed, the thickness of the top portion that is removed during the etching process E2 may larger than the thickness of the sidewall portion that is removed during the etching process E2. For example, after the etching process E2 is performed, the ratio of H2/H1 is, for example, 0.9, and the ratio of W2/W1 is, for example, 0.95. Another method of performing the etching process E2 is firstly to oxidize the top surface and the sidewall of the fin structure 102, such as using an in-situ steam generation (ISSG) to conformally form an oxide layer (not shown) on the fin structure 102, and an etching process is then performed to remove the oxide layer, so as to "shrink" the fin structure 102. The etching process that is performed after the oxide layer is formed mentioned above is not limited to a dry-etching process or a wet-etching process. If the etching process is a wet-etching process, the dilute HF (DHF) can be used as the etchant, and the dry-etching process such as a SiCoNi™ process to selectively remove the oxide layer disposed on the surface of the fin structure 102. In addition, since the oxide layer is conformally formed on the surface of the fin structure 102, after the etching process E2 is performed, the thickness of the top portion of the fin structure 102 which is removed during the etching process E2 is very close or almost equal to the thickness of the sidewall portion of the fin structure 102 which is removed during the etching process E2.

Figure 6:
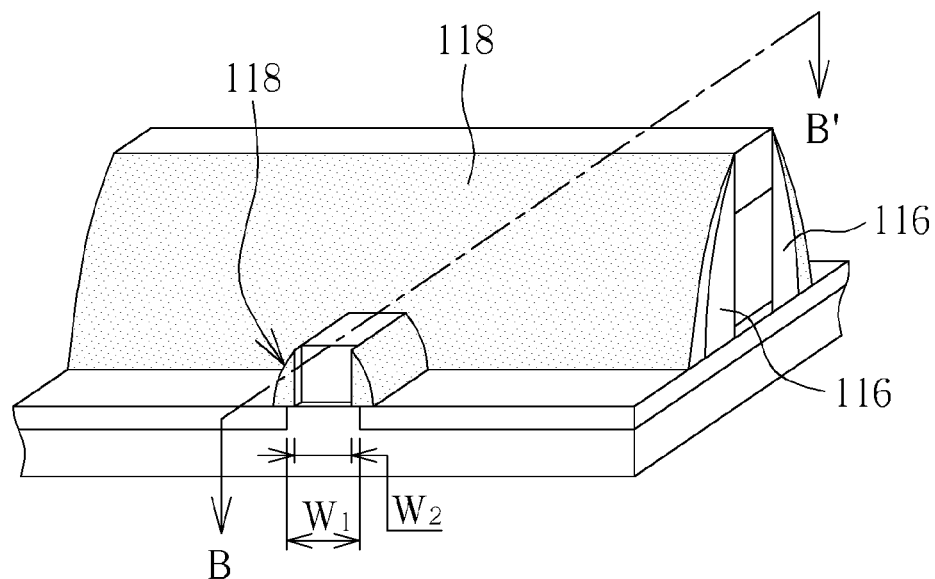
Figure 6A:
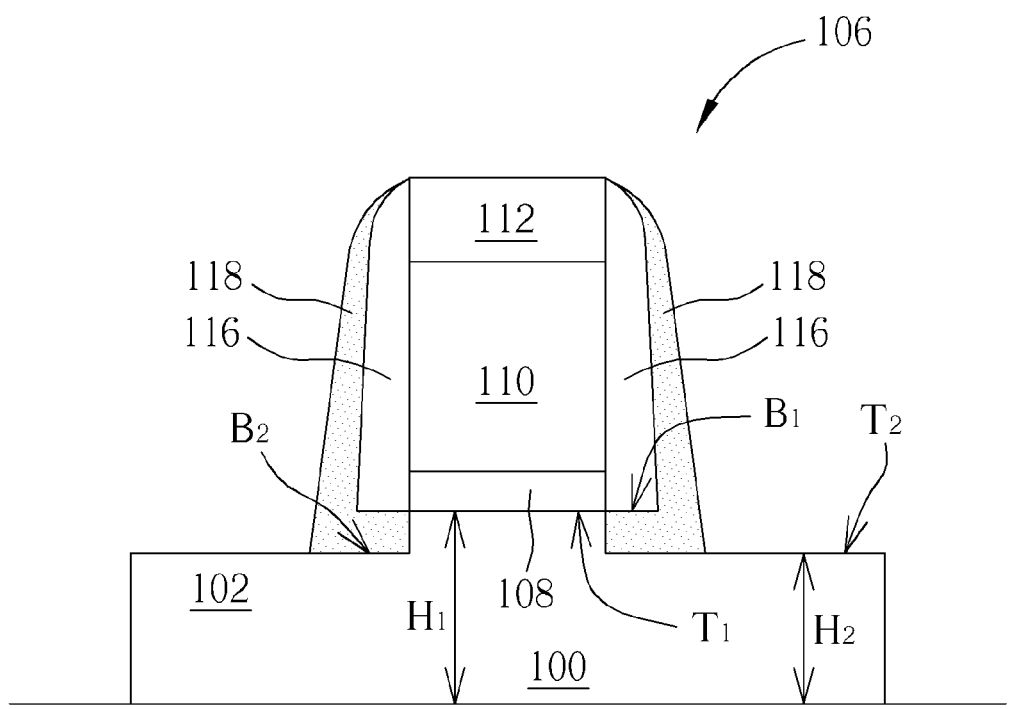
FIG. 6A is the cross section diagram of the semiconductor structure along cross section line B-B' of FIG. 6.

Please refer to FIG. 6 and FIG. 6A, wherein FIG. 6A is the cross section diagram of the semiconductor structure along cross section line B-B' of FIG. 6. As shown in FIG. 6, after the etching process E2 is performed, an outer spacer 118 is then formed on the outer surface of the inner spacer 116, wherein the method for forming the outer spacer 118 is similar to the method for forming the inner spacer 116 mentioned above, for example, entirely forming a dielectric layer (not shown) on the substrate 100, the fin structure 102, the insulating layer 104 and the gate structure 106, and an etching process is then performed to remove parts of the dielectric layer. The other details for forming the outer spacer 118 are the same as the method for forming the inner spacer 116, and will not be redundantly described here. In addition, if the substrate 100 comprises different semiconductor devices having different types (such as comprises a PMOS region and a NMOS region), the outer spacer 118 can only be formed within a specific region. For example, if the applicant wants to form the outer spacer 118 within the PMOS region only but not form the outer spacer 118 within the NMOS region, after the dielectric layer mentioned is formed, a photoresist layer covers the dielectric layer within the NMOS region. In this way, after the etching process is performed, the outer spacer 118 will only be formed within the PMOS region, but the NMOS region is still covered by the dielectric layer. The process mentioned above should also be comprised in the scope of the present invention.

After the step of forming the outer spacer is completed, the outer spacer 118 covers the outer surface of the inner spacer 116, and covers a portion of the top surface and the sidewalls of the fin structure 102. It is noteworthy that as shown in FIG. 6A, a space 120 which is disposed between the second top surface T2 and the bottom surface B1 of the inner spacer 116 is formed during the etching process E2, so the outer spacer 118 not only contacts the second top surface T2 of the fin structure 102, but also fills in the space 120. As shown in FIG. 6A, the inner spacer 116 does not directly contact the sidewall S1 that is between the first top surface T1 and the second top surface T2, but outer spacer 118 directly contacts the sidewall S1 that is between the first top surface T1 and the second top surface T2.

It is noteworthy that in the present invention, please still refer to FIG. 6A, before the etching process E2 is performed, the bottom surface of the inner spacer 116 which is disposed on the top surface of the fin structure 102 is defined as the bottom surface B1, and after the etching process E2 is performed, the bottom surface of the outer spacer 118 which is disposed on the top surface of the fin structure 102 is defined as the bottom surface B2. The bottom surface B1 and the first top surface T1 are on the same level, the bottom surface B2 and the second top surface T2 are on the same level.

Figure 7:
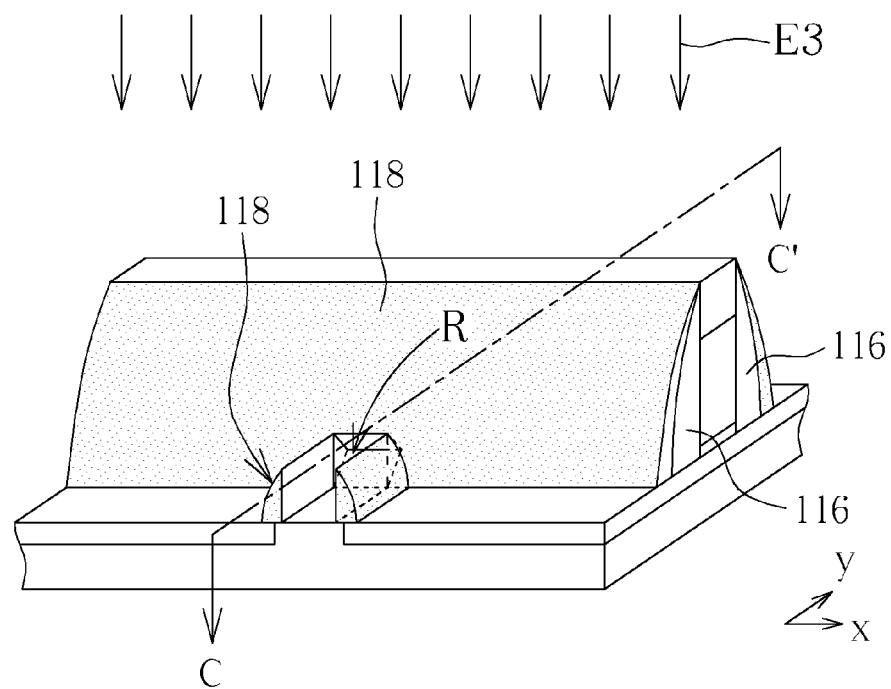
Figure 7A:
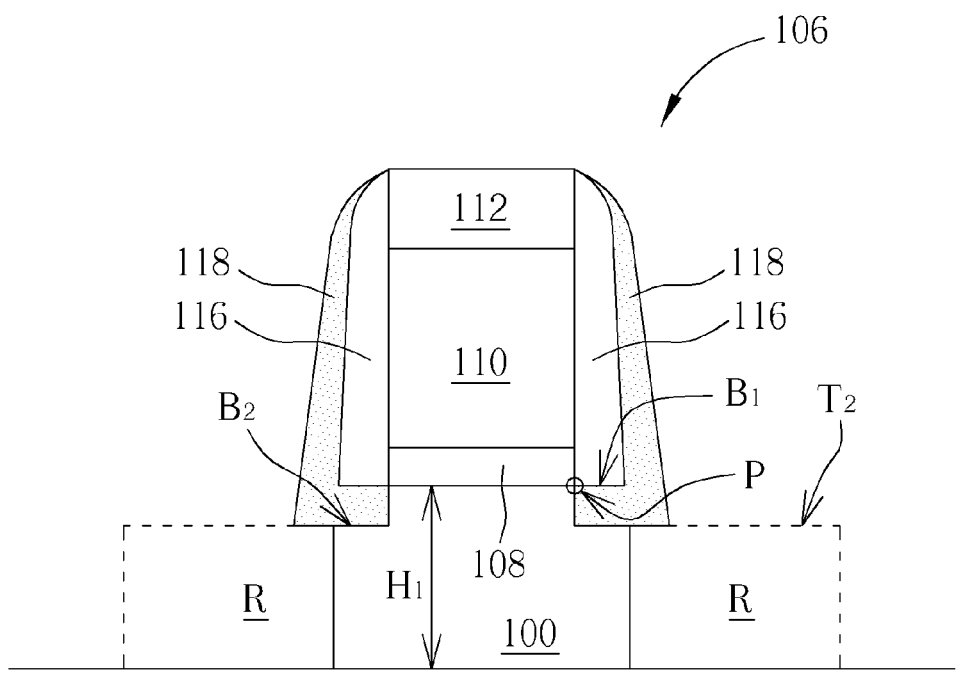
FIG. 7A is the cross section diagram of the semiconductor structure along cross section line C-C' of FIG. 7.

As shown in FIG. 7, an etching process E3 is performed to etch a part of the fin structure 102 beside the gate structure 106, so that a recess R in the fin structure 102 is formed on either side of the gate structure 106 respectively. In the present invention, the etching process E3 may be a dry-etching process or a wet-etching process. FIG. 7A is the cross section diagram of the semiconductor structure along cross section line C-C' of FIG. 7. As shown in FIG. 7A, after the etching process E3 for forming the recess R or after the following cleaning process is performed, the sidewall of the fin structure within the recess R may be pulled down (shrunk inwardly). In other words, the sidewall of the fin structure within the recess R may be further closer to the gate structure 106. In the conventional process, this step may damage the corner P between the gate dielectric layer 108 and the fin structure 102, and further influence the performance of the semiconductor structure. However, in the present invention, since the corner P is protected by the outer spacer 118, even though the sidewall of the fin structure 102 within the recess R is shrunk and close to the gate structure 106, the corner P will not be etched by the etchant, thereby increasing the stability of the semiconductor structure.

Figure 8:
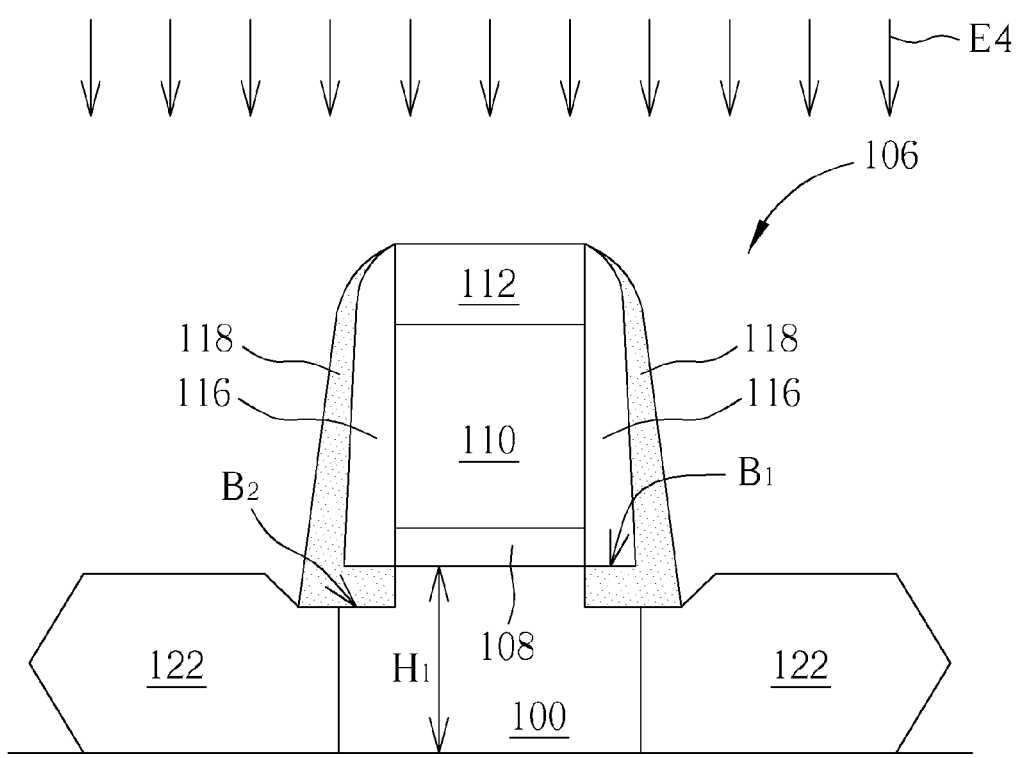

As shown in FIG. 8, an epitaxial process E4 is performed to form an epitaxial layer 122 having a hexagon-shaped profile structure in the recess R. The epitaxial layer 122 may include a silicon-germanium epitaxial layer suited for a PMOS transistor, or a silicon-carbide epitaxial layer suited for an NMOS transistor, depending upon the electrical properties of the Multi-gate MOSFET. The epitaxial layer 122 is formed in the recess R, and grows conformally along the shape of the recess R, therefore having a hexagon-shaped profile structure. Thereafter, an ion implantation process may be performed to dope impurities, or impurities may be doped while performing the epitaxial process E4, so that the epitaxial layer 122 can be used as a source/drain region. After the epitaxial layer 122 is formed, a silicide process (or a salicide process, not shown) may be performed to form silicide in the source/drain region, wherein the silicide process may include a post clean process, a metal depositing process, an annealing process, a selective etching process, or a test process, etc. Thereafter, other processes may be performed after the silicide process is performed.

In summary, please refer to FIG. 6A and FIG. 7A, the important feature of the present invention is that after the inner spacer 116 is formed, an additional etching process (pull down process) E2 is performed, so as to shrink the height and the width of the fin structure 102. The height and the width of the fin structure 102 are shrunk 5%~10%, and therefore the space 120 will be formed right under the inner spacer 116. The outer spacer 118 is then filled in the space 120, and contacts the sidewall S1 of the fin structure 102 directly. In this way, the fin structure 102 and the gate structure 106 can be protected well, especially the corner P between the gate dielectric layer 108 and the fin structure 102, avoiding the corner P be damaged by others etching processes, such as the pre-cleaning process of the following epitaxial process, and thereby further increasing the quality of the semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate, having a fin structure disposed thereon;
a gate structure, crossing over parts of the fin structure, wherein a top surface of the fin structure which is covered by the gate structure is defined as a first top surface, and a top surface of the fin structure which is not covered by the gate structure is defined as a second top surface, the first top surface being higher than the second top surface; and
a spacer, covering sidewalls of the gate structure, wherein the spacer includes an inner spacer and an outer spacer, the outer spacer is disposed on an outer surface of the inner spacer, and the outer spacer contacts the second top surface of the fin structure directly, and parts of the outer spacer are disposed right under the inner spacer, in addition, the outer spacer does not cover a top surface of the gate structure.

2. The semiconductor structure of claim 1, wherein at least parts of the outer spacer is disposed between the inner spacer and the fin structure.

3. The semiconductor structure of claim 1, wherein the inner spacer comprises a bottom surface, and the bottom surface of the inner spacer and the first top surface are on the same level.

4. The semiconductor structure of claim 1, wherein the outer spacer comprises a bottom surface, and the bottom surface of the outer spacer and the second top surface are on the same level.

5. The semiconductor structure of claim 1, wherein the fin structure further comprises a first sidewall, and the first sidewall is disposed between the first top surface and the second top surface.

6. The semiconductor structure of claim 5, wherein the inner spacer does not contact the first sidewall directly.

7. The semiconductor structure of claim 5, wherein the outer spacer contacts the first sidewall directly.

8. The semiconductor structure of claim 1, wherein the height which from the substrate to the first top surface is defined as a first height, the height which from the substrate to the second top surface is defined as a second height, and the ratio of the second height to the first height is between 0.9~0.95.

9. The semiconductor structure of claim 1, wherein a top surface of the inner spacer, a top surface of the outer spacer and the top surface of the gate structure are on a same level.

* * * * *